US011777152B2

(12) United States Patent
Hess et al.

(10) Patent No.: US 11,777,152 B2
(45) Date of Patent: Oct. 3, 2023

(54) DISTRIBUTED FEEDBACK CONTROL SYSTEMS AND LOGIC FOR BATTERY MANAGEMENT SYSTEM (BMS) OPERATION

(71) Applicant: GM GLOBAL TECHNOLOGY OPERATIONS LLC, Detroit, MI (US)

(72) Inventors: Thomas M. Hess, Birmingham, MI (US); Katherine M. Kolar, Clawson, MI (US); Fiona E. Meyer-Teruel, Detroit, MI (US); Robert W. Chalfant, Berkley, MI (US); Jason A. Lupienski, Birmingham, MI (US); Michael P. Barker, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 404 days.

(21) Appl. No.: 17/007,115

(22) Filed: Aug. 31, 2020

(65) Prior Publication Data
US 2022/0069368 A1 Mar. 3, 2022

(51) Int. Cl.
*H01M 10/42* (2006.01)
*H04W 4/80* (2018.01)
*H04W 4/70* (2018.01)
*G01R 31/371* (2019.01)
*B60L 58/12* (2019.01)
(Continued)

(52) U.S. Cl.
CPC ......... *H01M 10/4257* (2013.01); *B60L 58/12* (2019.02); *B60L 58/16* (2019.02); *G01R 31/371* (2019.01); *G01R 31/396* (2019.01); *H04W 4/70* (2018.02); *H04W 4/80* (2018.02); (Continued)

(58) Field of Classification Search
CPC ..... H01M 10/4257; H01M 2010/4271; H01M 2010/4278; H04W 4/70; H04W 4/80; G01R 31/396; G01R 31/371; B60L 58/12; B60L 58/16
See application file for complete search history.

(56) References Cited

U.S. PATENT DOCUMENTS

6,031,354 A    2/2000   Wiley et al.
9,018,862 B2   4/2015   Itoigawa
(Continued)

*Primary Examiner* — Brian R Ohara
*Assistant Examiner* — Aaron J Salter
(74) *Attorney, Agent, or Firm* — Quinn IP Law (57) ABSTRACT

Presented are feedback control systems for monitoring battery system hardware, methods for making/operating such systems, and vehicles with wireless battery management systems (WBMS) governed through distributed feedback control. A method of operating a WBMS includes a wireless-enabled manager device selecting a batch of cell module assemblies (CMA) within the WBMS to communicate with to thereby retrieve data for their respective battery modules. A manager access control list (ACL) is created with respective media access control (MAC) addresses and ID data for the selected CMAs. A wireless connection is established between the manager device and a respective cell monitoring unit (CMU) for each selected CMA based on the corresponding MAC addresses and ID data in the manager ACL. The manager device downloads, from the CMU of each selected CMA, device data for each battery modules associated with the selected CMA. The manager device then switches the operating mode for each CMU.

20 Claims, 4 Drawing Sheets

(51) Int. Cl.
*B60L 58/16* (2019.01)
*G01R 31/396* (2019.01)

(52) U.S. Cl.
CPC ............... *H01M 2010/4271* (2013.01); *H01M 2010/4278* (2013.01)

(56) References Cited

U.S. PATENT DOCUMENTS

| | | |
|---|---|---|
| 9,496,720 B2 | 11/2016 | McShane et al. |
| 2002/0055978 A1 | 5/2002 | Joon-Bo et al. |
| 2002/0124125 A1 | 9/2002 | Bormann et al. |
| 2003/0128111 A1 | 7/2003 | Sano et al. |
| 2003/0195019 A1 | 10/2003 | Litwin |
| 2007/0234332 A1 | 10/2007 | Brundridge et al. |
| 2015/0028816 A1 | 1/2015 | Lee |
| 2017/0033587 A1* | 2/2017 | Hong .................. H02J 7/00034 |
| 2017/0288956 A1* | 10/2017 | Chudy ................ H04L 41/0803 |
| 2019/0242949 A1* | 8/2019 | Lemkin ................ H01M 10/42 |
| 2019/0252735 A1* | 8/2019 | Sung ................... H01M 10/425 |
| 2020/0006988 A1* | 1/2020 | Leabman ............... H02J 50/60 |
| 2020/0076014 A1 | 3/2020 | Garelli et al. |

\* cited by examiner

DISTRIBUTED FEEDBACK CONTROL SYSTEMS AND LOGIC FOR BATTERY MANAGEMENT SYSTEM (BMS) OPERATION

INTRODUCTION

The present disclosure relates generally to battery systems. More specifically, aspects of this disclosure relate to systems, methods, and devices for monitoring traction battery modules and attendant hardware of wireless battery management systems.

Current production motor vehicles, such as the modern-day automobile, are equipped with a powertrain that operates to propel the vehicle and power the vehicle's onboard electronics. In automotive applications, for example, the vehicle powertrain is generally typified by a prime mover that delivers driving torque through an automatic or manually shifted power transmission to the vehicle's final drive system (e.g., differential, axle shafts, road wheels, etc.). Automobiles have historically been powered by a reciprocating-piston type internal combustion engine (ICE) assembly due to its ready availability and relatively inexpensive cost, light weight, and overall efficiency. Such engines include compression-ignited (CI) diesel engines, spark-ignited (SI) gasoline engines, two, four, and six-stroke architectures, and rotary engines, as some non-limiting examples. Hybrid electric and full electric ("electric-drive") vehicles, on the other hand, utilize alternative power sources to propel the vehicle and, thus, minimize or eliminate reliance on a fossil-fuel based engine for tractive power.

A full electric vehicle (FEV)—colloquially branded as an "electric car"—is a type of electric-drive vehicle configuration that altogether removes the internal combustion engine and attendant peripheral components from the powertrain system, relying solely on a rechargeable energy storage system (RESS) and a traction motor for vehicle propulsion. The engine assembly, fuel supply system, and exhaust system of an ICE-based vehicle are oft-replaced with a single or multiple traction motors, a traction battery pack, and battery cooling and charging hardware in an FEV. Hybrid electric vehicle (HEV) powertrains, in contrast, employ multiple sources of tractive power to propel the vehicle, most commonly operating an internal combustion engine assembly in conjunction with a battery-powered or fuel-cell-powered traction motor. Since hybrid-type, electric-drive vehicles are able to derive their power from sources other than the engine, HEV engines may be turned off, in whole or in part, while the vehicle is propelled by the electric motor(s).

Most commercially available hybrid electric and full electric vehicles employ a rechargeable traction battery pack to store and supply the requisite power for operating the powertrain's traction motor(s). In order to generate tractive power with sufficient vehicle range and speed, a traction battery pack is significantly larger, more powerful, and higher in capacity (Amp-hr) than a standard 12-volt starting, lighting, and ignition (SLI) battery. Contemporary traction battery packs (also referred to as "electric vehicle battery" or "EVB") group stacks of battery cells into individual battery modules that are mounted onto the vehicle chassis, e.g., via a battery housing and/or support tray. Stacked electrochemical battery cells may be connected in series or parallel through use of an electrical interconnect board (ICB). The electrical tabs of the individual battery cells, which project out from the module housing, are bent against and welded to shared busbar plates. A dedicated Battery Pack Control Module (BPCM), through collaborative operation with a Powertrain Control Module (PCM), regulates the opening and closing of battery pack contactors to govern operation of the battery pack for powering the vehicle's traction motor(s).

To help improve system performance, extend battery life, and increase vehicle range, a battery management system (BMS) monitors and modulates real-time operation of the individual modules within the traction battery pack. For some BMS architectures, a dedicated microprocessor-based cell monitoring unit (CMU) is integrated into each battery module to collectively define a cell module assembly (CMA). A resident BMS manager device is wired to the CMU devices and systematically collects operating state information (e.g., battery cell/module state of charge (SOC), temperature, voltage, etc.) for the battery modules. The use of a battery management system facilitates selective battery data collection for in-vehicle data storage during active use and periods of dormancy of the battery pack. Periods of dormancy may be experienced prior to installation of an assembled battery module or pack into a host system. For instance, a battery module may be manufactured in one location, and thereafter packaged and shipped—possibly over an extended distance—to an assembly plant located in another location. The battery modules may be warehoused prior to shipping or between the point of manufacture and the ultimate point of integration into the host system. Extended periods of dormancy may result in informational "black holes" that, if left unchecked, may diminish long-term control accuracy and efficiency of the modules.

SUMMARY

Presented herein are distributed feedback control systems with attendant control logic for monitoring battery system hardware, methods for making and methods for operating such systems, and electric-drive vehicles with wireless battery management systems (WBMS) governed through distributed feedback control. By way of illustration, disclosed systems and processes allow wireless-enabled CMAs, traction battery packs, and other powertrain devices to be remotely monitored, e.g., to derive real-time updates on each device's state of health, operating mode, present and past operating data, etc. A database of the collected data is developed to provision simplified and expedited access to WBMS device information. An intelligent feedback control system wirelessly monitors a batch of WBMS devices—whether in storage, transit, or in the assembly plant—without the need for manually plugging each device into a master control device.

Multiple wireless-enabled electrified powertrain devices may be monitored simultaneously, both pre and post-production, to regulate and track each device's location, destination, mode, SOH, etc. The host feedback control system may utilize a manager device with inventory software enabling timer-based and continuous device monitoring, which may enable access control list (ACL) swapping employing media access control (MAC) address information pulled from the WBMS database. In this regard, each CMU may be programmed for independent timer-based wakeups and for continuous monitoring when connected to a manager device. New software written into the WBMS chip of each CMU enables data to be locally stored and transferred to manager devices in different operating modes: timed wakeup mode with a configurable timer that wakes the CMU to collect and store device data; managed-inventory mode for continuous device monitoring; and manager wakeup mode in which a manager device wakes the CMU, requests stored data, reads and then deletes the data from the device's resident memory, etc., all while the manager device is updating the WBMS database.

Attendant benefits for at least some of the disclosed concepts include distributed feedback control systems for actively monitoring a distributed network of wireless-enabled devices, for example, to aggregate device location, destination, SOH, SOC, MAC address, and/or history data for devices in storage, transit, production, use, or service. This may provide an avenue for actively detecting damaged and malfunctioning devices, including those with thermal propagation issues, to help prevent faulty devices and modules from being put into use. In addition to increasing customer confidence and reducing warranty claims, disclosed features also help to expand CMA and battery pack storage capabilities, boost vehicle driving range, and increase battery life expectancy.

Presented herein are feedback-control methods for making or using any of the disclosed monitoring systems, battery management systems, and/or electric-drive vehicles. In an example, a method is presented for operating a wireless battery management system. The WBMS manages multiple cell module assemblies, each of which may be typified by a battery module with a respective cell monitoring unit that helps to track and manage the operating parameters of the stacked cells within the module. This representative method includes, in any order and in any combination with any of the above and below disclosed options and features: selecting, e.g., via user input, scheduled inventory management reminder, or broadcast prompt received by a wireless-enabled manager device, a batch of the CMAs from which the manager device will retrieve device data for their respective battery modules; generating, e.g., via a remotely located host computer, a manager access control list with a respective MAC address and ID data (e.g., serial number, make, model, etc.) for each selected CMA; establishing a wireless connection, e.g., via WiFi, radio frequency (RF), cellular network, near-field communication (NFC), BLUETOOTH®, etc., between the manager device and the respective CMU of each selected CMA based on the corresponding MAC address and ID data in the manager ACL; downloading, e.g., via the manager device from the CMU of each selected CMA, device data for each battery module associated with that CMA; and switching, e.g., via command prompt transmitted by the manager device, an operating mode for each of the respective CMUs.

Also presented herein are distributed feedback control systems for governing operation of WBMSs. By way of example, a host system is presented for monitoring a WBMS. The host system includes a WBMS database for storing device data, a wireless-enabled manager device that exchanges data with the WBMS database, and an optional host computer that is remote from and wirelessly connected to the manager device. The manager device is programmed to: select, from multiple cell module assemblies each having a respective battery module and a respective cell monitoring unit, a batch of the CMAs to communicate with and thereby retrieve data for their respective battery modules; call-up a manager access control list with respective media access control addresses and identification data for the selected CMAs; wirelessly connect to the CMU of each selected CMA using the corresponding MAC address and ID data in the manager ACL; download, from the CMU of each selected CMA, device data for the battery module associated with the selected CMA; and command each CMU to switch operating modes.

For any of the disclosed systems, methods, devices, and vehicles, the CMAs may be programmed to transmit their respective MAC addresses and ID data to the WBMS database prior to creation of the manager ACL. In this instance, generating a manager ACL includes retrieving the respective MAC address and ID data for each selected CMA from the WBMS database. Moreover, generating the manager ACL may further include the remotely located host computer retrieving the respective MAC addresses and ID data, creating a text file with the retrieved MAC addresses of the selected CMAs, and uploading the text file to the manager device. To assess whether or not the ACL was successfully updated, the manager ACL may be transmitted from the manger device to the host computer; the host computer then compares the manager ACL with a master ACL to determine if the MAC addresses in the manager ACL correspond with an associated list of MAC addresses in the master ACL. For instances in which the MAC addresses in the manager ACL do not correspond with those in the master ACL, the manager device may responsively select a new batch CMAs.

For any of the disclosed systems, methods, devices, and vehicles, selecting a batch of CMAs may include receiving a user-input selection from a MAC address book using a wireless interface library (WIL) installed on or accessed through the manager device (e.g., WIL may be hosted externally and interface with manager via established serial protocol). The WIL may responsively push a newly created ACL or retrieve an available ACL predefined for the particular user selection. This user-input selection from the WIL identifies which of the CMAs to communicate with the manager device. As yet a further option, establishing the wireless connection includes the manager device wirelessly transmitting an electronic ping to the CMU of each selected CMA. This electronic ping may cause the CMU to transition from a sleep mode to an awake mode. In this instance, the manager device may determine if a wireless connection is successfully established with each CMU; if not, the manager device may transmit a new electronic ping to each of the CMUs in which the wireless connection was not successfully established.

For any of the disclosed systems, methods, devices, and vehicles, the manager device may transmit a command prompt to the CMU of each selected CMA to clear device data from a resident memory device of the CMU after the manager device downloads the device data. Another option may include the manager device transmitting the downloaded device data for the battery modules of the selected CMAs to the WBMS database. The device data may include cell voltage data, cell temperature data, state of charge data, and/or cell state of health data. The manager device may also download respective location, destination, mode, and/or history data for each of the selected CMAs; this information may be drawn into a CMA database log by a host computer. As yet a further option, switching a CMUs operating mode may include transmitting a command prompt to the CMU to transition from a manager-prompted wake mode to a continuously awake inventory mode.

The above summary does not represent every embodiment or every aspect of this disclosure. Rather, the above features and advantages, and other features and attendant advantages of this disclosure, will be readily apparent from the following detailed description of illustrative examples and modes for carrying out the present disclosure when taken in connection with the accompanying drawings and the appended claims. Moreover, this disclosure expressly includes any and all combinations and subcombinations of the elements and features presented above and below.

Representative embodiments are shown by way of example in the drawings and will be described in detail below; it should be understood, however, that the novel aspects of this disclosure are not limited to the particular forms illustrated in the above-enumerated drawings. Rather, the disclosure is to cover all modifications, equivalents, combinations, subcombinations, permutations, groupings, and alternatives falling within the scope of this disclosure as encompassed, for instance, by the appended claims.

DETAILED DESCRIPTION

This disclosure is susceptible of embodiment in many different forms. Representative examples of the disclosure are shown in the drawings and herein described in detail with the understanding that these embodiments are provided as an exemplification of the disclosed principles, not limitations of the broad aspects of the disclosure. To that end, elements and limitations that are described, for example, in the Abstract, Introduction, Summary, Description of the Drawings, and Detailed Description sections, but not explicitly set forth in the claims, should not be incorporated into the claims, singly or collectively, by implication, inference, or otherwise. Moreover, the drawings discussed herein may not be to scale and are provided purely for instructional purposes. Thus, the specific and relative dimensions shown in the Figures are not to be construed as limiting.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and permutations thereof, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example. Lastly, directional adjectives and adverbs, such as fore, aft, inboard, outboard, starboard, port, vertical, horizontal, upward, downward, front, back, left, right, etc., may be with respect to a motor vehicle, such as a forward driving direction of a motor vehicle, when the vehicle is operatively oriented on a horizontal driving surface.

At present, there is no global tracking system for monitoring battery cell module assemblies and traction battery packs before and after assembly line production. Many current techniques necessitate each device be manually plugged into a master control device, and typically only collect data on an "as-needed" basis (e.g., just before pack install). By comparison, disclosed WBMS monitoring systems and methods allow for simultaneous wireless monitoring of multiple WBMS-connected devices that are in storage, transit, at the assembly plant, and/or after install. In addition to improving time-efficiencies, aspects of the disclosed concepts help to provide a security net for flagging damaged or malfunctioning CMAs, which leads to improved system performance, increased battery life, and more comprehensive product information available for optimized plant, storage, and shipping facility management.

New software applications written into the resident chips of WBMS-connected devices allow device data to be stored and, when desired, sent to WBMS manager devices in a variety of settings. The software may include a timer-based measurement mode in which a configurable timer "wakes" the device to collect and store WBMS data with settings to accommodate for excess data. As yet a further option, the software may include a managed-inventory mode for continuous or near-continuous monitoring of each device. The WBMS manager devices may be enabled to selectively wake a device, request stored data, read and delete data from the device, and concomitantly update the WBMS database with any retrieved data. The WBMS monitoring system and database are readily scalable and integrable into CMA/pack production, storage, shipping, and service nodes, any may be configured to track and store any logically relevant type of data, including device location, destination, diagnostics, fault, SOH, SOC, operating mode, historical data, etc.

A diverse selection of WBMS manager devices is also available, including antenna-based storage monitoring, storage rack managers, handheld tablet managers, and manager-equipped shipping containers. An antenna-based storage monitoring system allows for any one of multiple managers to broadcast over a large storage area and control multiple device groups. Comparatively, a storage rack manager is equipped and programmed to automatically monitor WBMS-connected devices on a designated shelf, set of shelves, or storage room. Handheld tablet managers, on the other hand, are designed to directly connect to multiple remotely located WBMS devices that are in storage or transit or in use. Manager-equipped shipping containers are equipped with a discrete WBMS manager device that collects data from the contents of the container.

According to a specific, yet non-limiting example, each CMU will be programmed with an inventory mode that allows the device to periodically wake, collect and store cell data, and transmit data to a master device. This allows the WBMS to take battery measurements every day (e.g., for up to six weeks) or multiple times a day (e.g., for two weeks). This inventory mode may be enabled for predefined parts of a CMU/battery pack's timeline in manufacturing, storage, service, or shipping. For instance, WBMS-connected battery modules, while in transit from one facility to another, may be equipped with a CMU that periodically wakes to collect battery cell data. When the shipment of battery modules arrives at a destination, a dedicated arrival manager may automatically update a corresponding ACL file and cycle through the shipments MAC address list. When connected to a battery module included with the shipment, the manager may automatically upload the module's data to a storage device while changing the operating mode on the CMU to a predefined mode for that destination facility. The WBMS database is updated with module ID, MAC address, and state of health data for each module, as well as current location and historical data. The WBMS allows for continuous monitoring of battery modules and their peripheral electrical hardware such that faulty or damaged modules are not placed into use and to prevent them from becoming hazardous while in storage.

Figure 1:
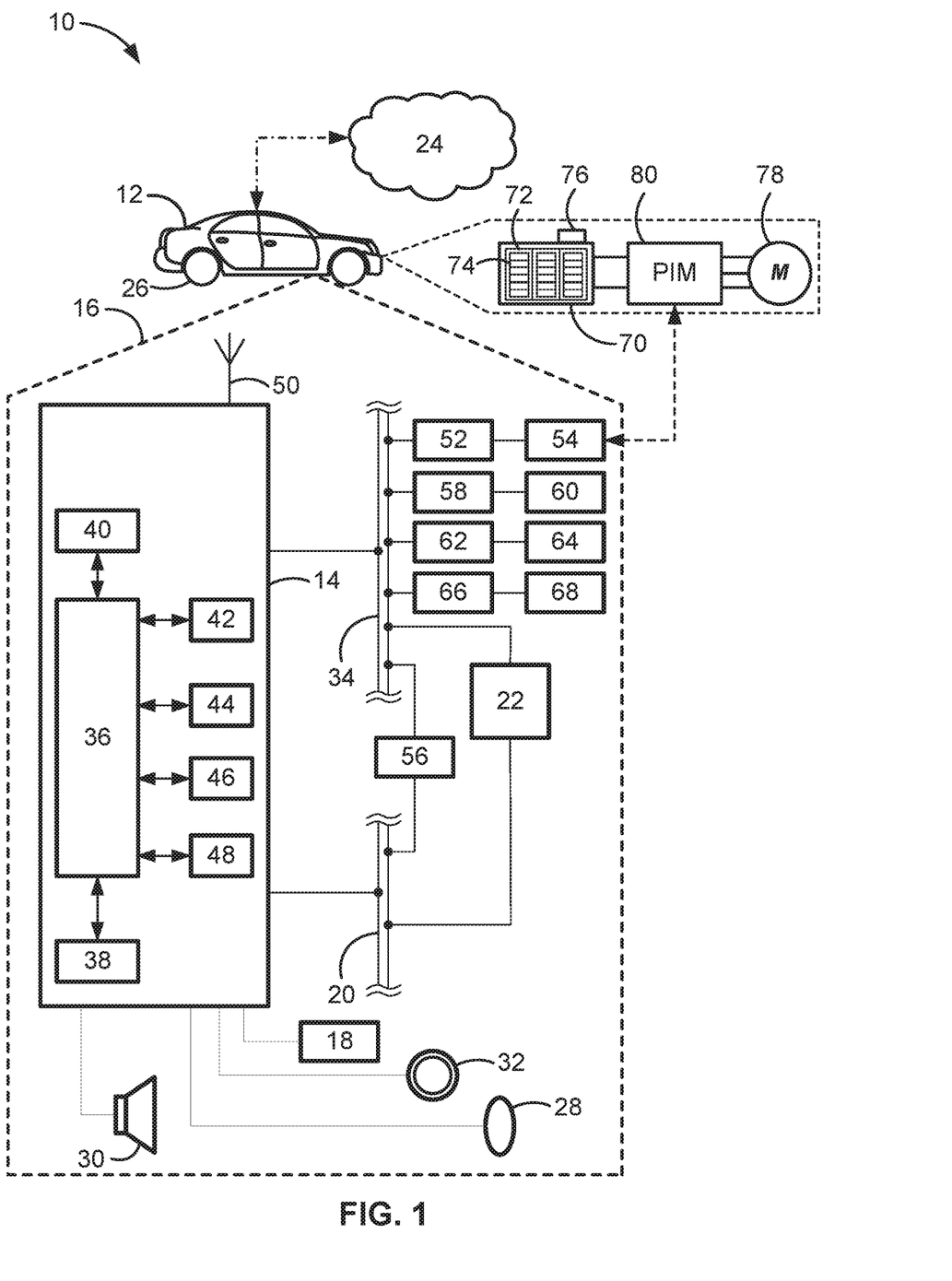
FIG. 1 is a schematic illustration of a representative electric-drive vehicle with a wireless battery management system that tracks and manages operation of battery modules in a traction battery pack of the vehicle according to aspects of the disclosed concepts.

Referring now to the drawings, wherein like reference numbers refer to like features throughout the several views, there is shown in FIG. 1 a representative automobile, which is designated generally at 10 and portrayed herein for purposes of discussion as a sedan-style, electric-drive passenger vehicle. The illustrated automobile 10—also referred to herein as "motor vehicle" or "vehicle" for short—is merely an exemplary application with which aspects of this disclosure may be practiced. In the same vein, implementation of the present concepts for a full electric vehicle should also be appreciated as a non-limiting application of novel features disclosed herein. As such, it will be understood that aspects and features of this disclosure may be applied to other electrified powertrain architectures, implemented for any logically relevant type of vehicle, and utilized for both automotive and non-automotive applications alike. Moreover, only select components of the motor vehicles and WBMS monitoring systems are shown and will be described in additional detail herein. Nevertheless, the vehicles and systems discussed below may include numerous additional and alternative features, and other available peripheral components, for carrying out the various methods and functions of this disclosure.

The representative vehicle 10 of FIG. 1 is originally equipped with a vehicle telecommunication and information ("telematics") unit 14 that wirelessly communicates (e.g., via cell towers, base stations, mobile switching centers, satellite service, etc.) with a remotely located or "off-board" cloud computing host service 24. Some of the other vehicle hardware components 16 shown generally in FIG. 1 include, as non-limiting examples, an electronic video display device 18, a microphone 28, one or more audio speakers 30, and assorted input controls 32 (e.g., buttons, knobs, switches, touchpads, keyboards, touchscreens, etc.). Generally, these hardware components 16 function, in part, as a human/machine interface (HMI) to enable a user to communicate with the telematics unit 14 and other systems and system components within the vehicle 10. Microphone 28 provides a vehicle occupant with means to input verbal or other auditory commands; the vehicle 10 may be equipped with an embedded voice-processing unit utilizing audio filtering, editing, and analysis software modules. Conversely, speaker 30 provides audible output to a vehicle occupant and may be either a stand-alone speaker dedicated for use with the telematics unit 14 or may be part of an audio system 22. The audio system 22 is operatively connected to a network connection interface 34 and an audio bus 20 to receive analog information, rendering it as sound, via one or more speaker components.

Communicatively coupled to the telematics unit 14 is a network connection interface 34, suitable examples of which include twisted pair/fiber optic Ethernet switch, internal/external parallel/serial communication bus, a local area network (LAN) interface, a controller area network (CAN), a media-oriented system transfer (MOST), a local interconnection network (LIN) interface, and the like. Other appropriate communication interfaces may include those that conform with ISO, SAE, and IEEE standards and specifications. The network connection interface 34 enables the vehicle hardware 16 to send and receive signals with each other and with various systems and subsystems both within or "resident" to the vehicle body 12 and outside or "remote" from the vehicle body 12. This allows the vehicle 10 to perform various vehicle functions, such as controlling vehicle steering, governing operation of the vehicle's transmission, modulating powertrain output, engaging/disengaging the brake system, regulating charge and discharge of the vehicle's battery modules, and other automated driving functions. For instance, telematics unit 14 receives and/or transmits data to/from a wireless battery management system (WBMS) module 52, a Battery Pack Control Module (BPCM) 54, a powertrain control module (PCM) 56, a sensor system interface module (SSIM) 58, a brake system control module (BSCM) 60, and assorted other vehicle ECUs, such as a transmission control module (TCM), a climate control module (CCM), etc.

With continuing reference to FIG. 1, telematics unit 14 is an onboard computing device that provides a mixture of services, both individually and through its communication with other networked devices. This telematics unit 14 is generally composed of one or more processors 40, each of which may be embodied as a discrete microprocessor, an application specific integrated circuit (ASIC), or a dedicated control module. Vehicle 10 may offer centralized vehicle control via a central processing unit (CPU) 36 that is operatively coupled to one or more electronic memory devices 38, each of which may take on the form of a CD-ROM, magnetic disk, IC device, flash memory, semiconductor memory (e.g., various types of RAM or ROM), etc., and a real-time clock (RTC) 42.

Long-range vehicle communication capabilities with remote, off-board networked devices may be provided via one or more or all of a cellular chipset/component, a navigation and location chipset/component (e.g., global positioning system (GPS) transceiver), or a wireless modem, all of which are collectively represented at 44. Close-range wireless connectivity may be provided via a short-range wireless communication device 46 (e.g., a BLUETOOTH® unit or near field communications (NFC) transceiver), a dedicated short-range communications (DSRC) component 48, and/or a dual antenna 50. It should be understood that the vehicle 10 may be implemented without one or more of the above listed components or, optionally, may include additional components and functionality as desired for a particular end use. The various communication devices described above may be configured to exchange data as part of a periodic broadcast in a V2V communication system or a vehicle-to-everything (V2X) communication system, e.g., Vehicle-to-Infrastructure (V2I), Vehicle-to-Pedestrian (V2P), and/or Vehicle-to-Device (V2D).

CPU 36 receives sensor data from one or more sensing devices that use, for example, photo detection, radar, laser, ultrasonic, optical, infrared, or other suitable technology for executing an automated driving operation, including short range communications technologies such as DSRC or Ultra-Wide Band (UWB). In accord with the illustrated example, the automobile 10 may be equipped with one or more digital cameras 62, one or more range sensors 64, one or more vehicle speed sensors 66, one or more vehicle dynamics sensors 68, and any requisite filtering, classification, fusion and analysis hardware and software for processing raw sensor data. The type, placement, number, and interoperability of the distributed array of in-vehicle sensors may be adapted, singly or collectively, to a given vehicle platform for achieving a desired level of autonomous vehicle operation.

To propel the electric-drive vehicle 10, an electrified powertrain is operable to generate and deliver tractive torque to one or more of the vehicle's road wheels 26. The powertrain is generally represented in FIG. 1 by a rechargeable energy storage system (RESS), which may be in the nature of a chassis-mounted traction battery pack 70 that is operatively connected to an electric traction motor 78. The traction battery pack 70 is generally composed of one or more battery modules 72 each having a stack of battery cells 74, such as lithium ion, lithium polymer, or nickel metal hydride battery cells of the pouch or prismatic type. One or more electric machines, such as traction motor/generator (M) units 78, draw electrical power from and, optionally, deliver electrical power to the RESS's battery pack 70. A power inverter module (PIM) 80 electrically connects the battery pack 70 to the motor/generator (M) unit(s) 78 and modulates that transmission of electrical current therebetween.

The battery pack 70 is configured such that module management, cell sensing, and module-to-module or module-to-host communication functionality is integrated directly into each battery module 72 and performed wirelessly via a corresponding wireless-enabled cell monitoring unit 76. The CMU 76 may be a microcontroller-based, printed circuit board (PCB)-mounted sensor array with GPS transceiver and RF capability and that is packaged on or in the battery module housing. The battery module cells 74, CMU 76, housing, coolant lines, busbars, etc., collectively define the cell module assembly. The disclosed configuration foregoes use of separate hard-wired electronic modules and serial connectors of the type used in the above-described cell sense board (CSB)-based topologies. Additional information regarding CMU architecture and CMA design may be retrieved from commonly owned U.S. Patent App. Pub. No. 2020/0076014 A1, to Matthew R. Garelli et al., which is incorporated herein by reference in its entirety and for all purposes.

Figure 2:
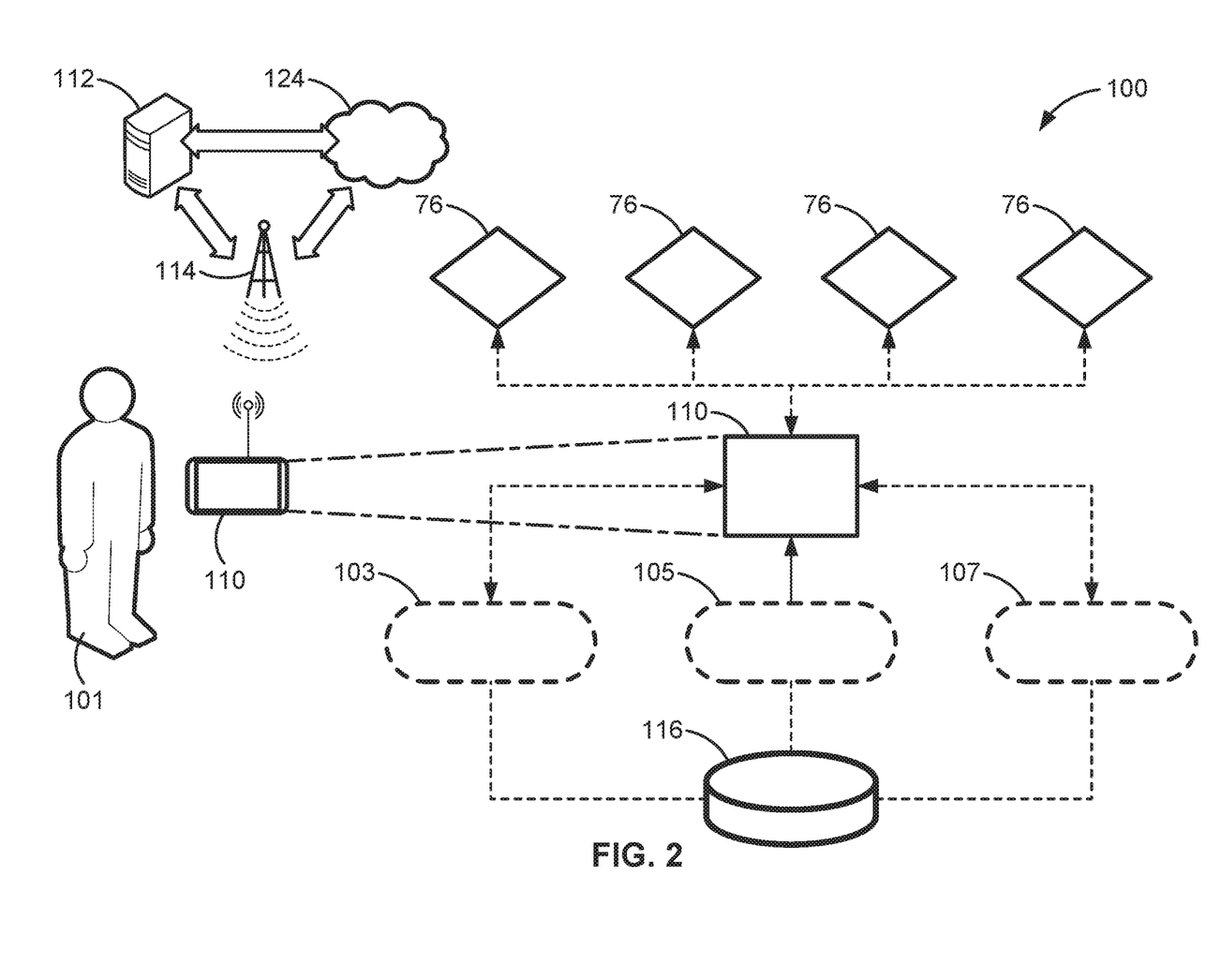
FIG. 2 is a schematic illustration of a representative host system for monitoring battery modules via a distributed network of cell monitoring units of a wireless battery management system in accordance with aspects of the present disclosure.

FIG. 2 portrays a distributed-feedback-control host system 100 for simultaneously monitoring a network of wireless-capable devices—whether in storage, transit, production or service—to derive real-time device data updates without the need to manually plug each device into a master control device. In accord with the illustrated example, a user 101 is operating a portable computing (manager) device 110 to wirelessly communicate with, and thereby retrieve device data from, the cell monitoring units 76 of multiple battery modules 74 in a wireless battery management system. Manager device 110 may be a hand-held tablet computer, smartphone, laptop, or other similarly suitable computing device that communicatively couples to a remote host computer 112 or a cloud computing host service 124 via a wireless communications network 114. Wireless data exchanges between the manager device 110, CMUs 76, host computer 112, host service 124, and database 116 may be conducted via short-range wireless communication (e.g., a BLUETOOTH® unit, near field communication (NFC) transceiver, dedicated short-range communications (DSRC) component, etc.) or long-range wireless communication (e.g., a radio antenna, WiFi card, cellular network chip, etc.). While illustrating a single user 101 communicating over the host system 100 with four (4) CMUs 72 of a single motor vehicle 10, it is envisioned that numerous users may communicate with any number and type of wireless-enabled vehicle devices of multiple motor vehicles or non-automotive devices that are suitably equipped for wirelessly exchanging information and data.

With continuing reference to FIG. 2, the host computer 112 may be implemented as a high-speed server class computing device or a mainframe computer capable of handling bulk data processing, resource planning, and database administration. For instance, the host computer 112 may operate as the host in a client-server interface for conducting any necessary data exchanges and communications with one or more "third party" servers to achieve a desired function. The cloud computing host service 124, on the other hand, may operate as middleware for IoT (Internet of Things), WoT (Web of Things), and/or V2V or V2X services, connecting an assortment of heterogeneous electronic devices with a service oriented architecture (SOA) via a data network. Network 114 may be any available type of network, including a combination of public distributed computing networks (e.g., Internet) and secured private networks (e.g., local area network, wide area network, virtual private network). It may also include wireless and wireline transmission systems (e.g., satellite, cellular network, terrestrial networks, etc.).

As part of the present approach, each CMU 76 stores, measures and reports battery data inclusive of a condition log 103 (e.g., individual cell voltages and temperatures, module SOH and SOC data, battery capacity and open-circuit voltage, and other real-time and historical device data), device-specific data 105 (e.g., MAC address, serial number, make, model and year, etc.) and location data 107 (e.g., real-time geodetic position, destination, route, etc.). The CMUs 76 are individually programmed with a software switch that enables separate operating modes of the CMU 76; such operating modes are described in detail below with particular reference to FIGS. 3 and 4. CMU operating modes may include, singly and in any combination: (1) a time-regulated "Timer Mode" with a configurable timer (comparable to RTC 42) that wakes a CMU to collect and store device data in accordance with a present schedule; (2) a "Managed-Inventory Mode" that enables a CMU to perform continuous or near-continuous monitoring for a preset window of time or for the duration this Mode is enabled; (3) a "Manager Mode" in which a manager device selectively wakes a CMU, requests stored data, reads and deletes data from the device's resident memory, and then sleeps the CMU; (4) an "Active Mode" that enables real-time monitoring and streaming of battery data for a battery module that is integrated into an electrified powertrain or other system and commanded to actively charge or discharge; (5) a "Storage Mode" that transitions a CMU to a low-power-consumption state when a battery module within a CMA becomes dormant for a calibrated duration; and (6) a "Transitional Mode" for prepping a CMU to switch from Active Mode to Storage Mode, and vice versa.

Figure 3:
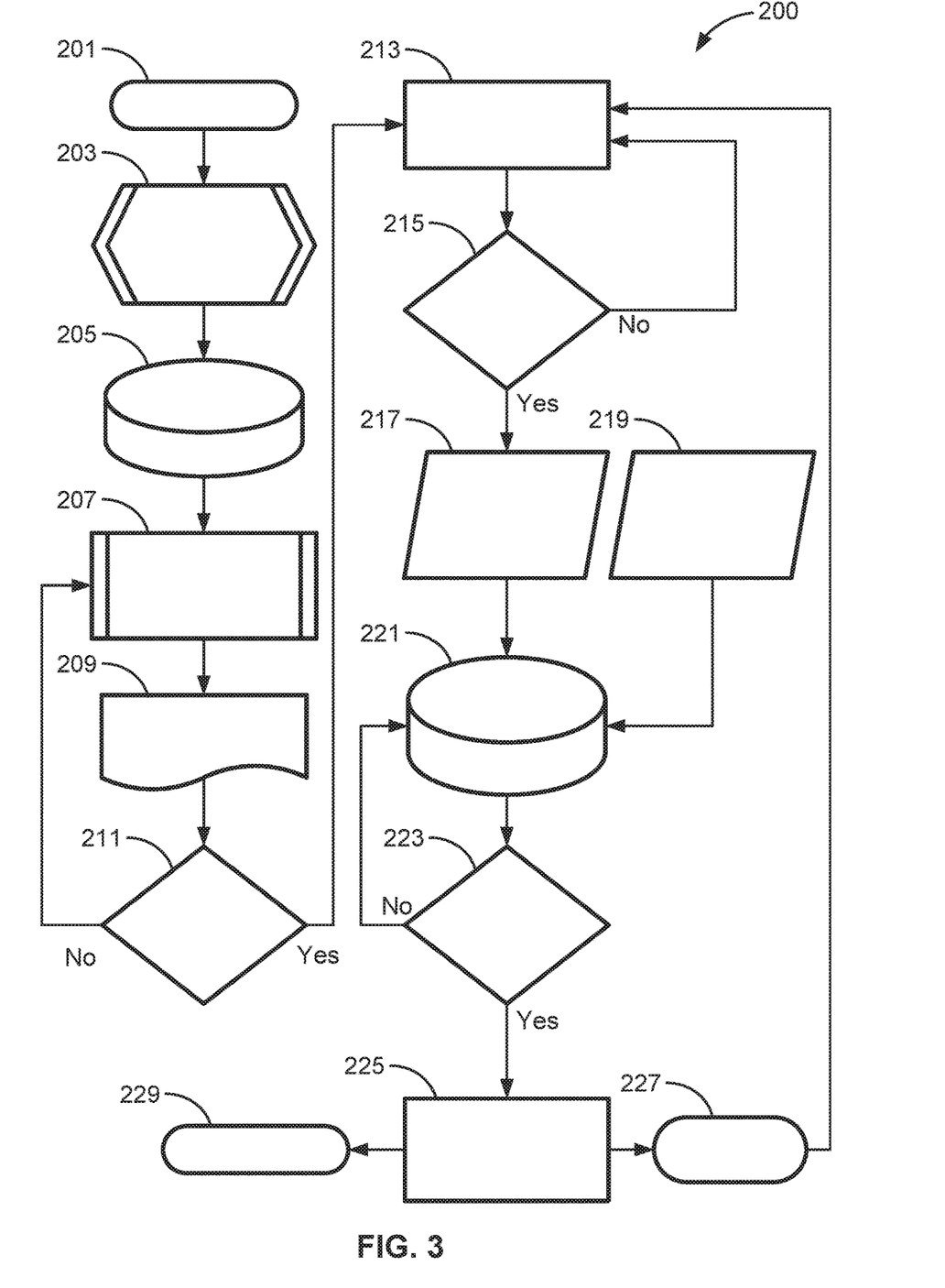
FIG. 3 is a flowchart illustrating a representative WBMS inventory monitoring protocol, which may correspond to memory-stored instructions executed by an onboard or remote controller, control-logic circuit, programmable control unit, or other integrated circuit (IC) device or network of devices in accord with aspects of the disclosed concepts.
Figure 4:
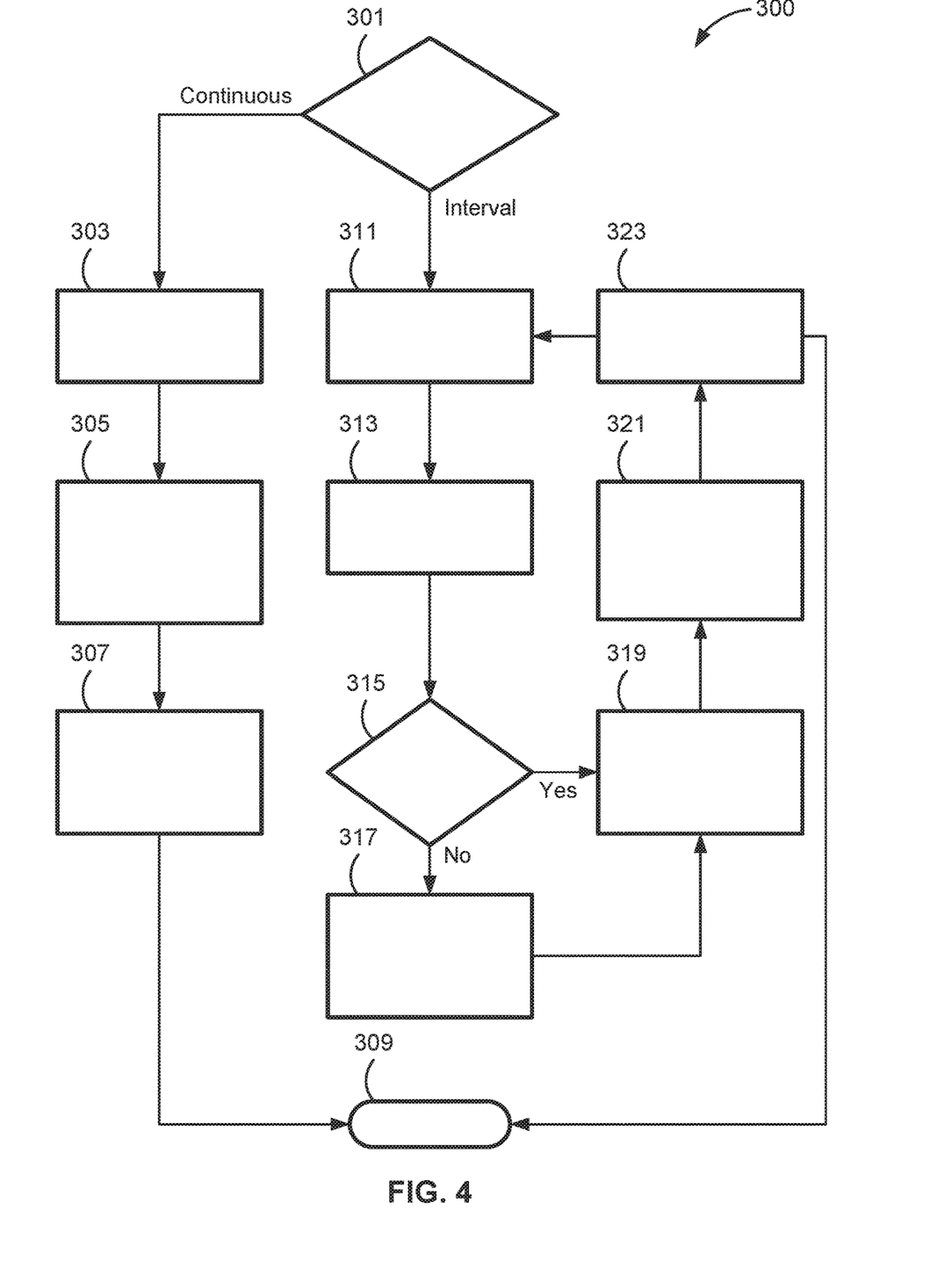
FIG. 4 is a flowchart illustrating a representative WBMS inventory mode protocol, which may correspond to memory-stored instructions executed by an onboard or remote controller, control-logic circuit, programmable control unit, or other integrated circuit (IC) device or network of devices in accord with aspects of the disclosed concepts.

With reference next to the flow chart of FIG. 3, an improved method or control strategy for tracking and managing one or more battery modules, such as traction battery module(s) 72 of FIG. 1, through wireless-capable monitoring devices, such as CMUs 74 of FIG. 1, using a distributed feedback control system, such as centralized host system 100 of FIG. 2, is generally described at 200 in accordance with aspects of the present disclosure. Likewise, FIG. 4 illustrates a representative inventory mode selection control strategy or method 300 that may be combined with, or may operate as a standalone application from, the method 200 of FIG. 3. Some or all of the operations illustrated in FIGS. 3 and 4 and described in further detail below may be representative of an algorithm or algorithms that each corresponds to processor-executable instructions that may be stored, for example, in main or auxiliary or remote memory, and executed, for example, by an electronic controller, processing unit, control logic circuit, or other module or device or network of modules/devices, to perform any or all of the above and below described functions associated with the disclosed concepts. It should be recognized that the order of execution of the illustrated operation blocks may be changed, additional operation blocks may be added, and some of the described operations may be modified, combined, or eliminated.

Method 200 of FIG. 2 begins at terminal block 201 with memory-stored, processor-executable instructions for a programmable controller or control module or similarly suitable processor to call up an initialization procedure for a WBMS inventory monitoring protocol. This routine may be executed in real-time, continuously, systematically, sporadically and/or at regular intervals, for example, each 100 milliseconds during normal device operation after placement into service. As yet another option, terminal block 201 may initialize responsive to a user command prompt (e.g., input via manager device 110) or a broadcast prompt signal received from a centralized host system (e.g., host computer 112). Method 200 advances from terminal block 201 to manufacturing process block 203, whereat multiple CMAs are produced, for example, at a dedicated battery manufacturing plant. Assembled battery modules may await transport in a warehouse facility and, optionally, may be temporarily stowed on a storage rack. A dedicated storage rack manager located at the battery manufacturing plant/warehouse facility may monitor the CMAs prior to transport.

After CMA production at manufacturing process block 203, device-specific data for each CMA is uploaded to a WBMS database, as indicated at database storage block 205 of FIG. 3. By way of non-limiting example, a preliminary log file may be generated for each cell module assembly as it comes off the battery production line. The cell monitoring unit for each CMA may be programmed to automatically upload the log file, or predefined portions thereof, to the WBMS database 116. This preliminary log file may contain a distinct MAC address (or an internet protocol (IP) address), a serial number, address resolution protocol (ARP) information, etc., to facilitate device identification and communication. The log file may also record the device's initial history, including a preliminary state of health assessment from an "end of line" test, location data, default operating mode settings, and operator notes to be added into the database (e.g., diagnostics report, repair notes, creation date, intended destination, start location, etc.)

Method 200 advances from database storage block 205 to subroutine process block 207 to call-up an application software program for selecting which CMU or CMUs will be solicited for device data. This program may be built within a procedurally structured and object-oriented programming language (e.g., PYTHON®) and provide a feature suite with scripts for identifying, logging, and parsing CMU data. By way of illustration, manager device 110 of FIG. 2 may connect to the remotely located host computer 112 and access (e.g., when host 112 acting as middleware API) or install (e.g., when manager 110 operating as standalone device) a wireless interface library (WIL). The WIL may operate as a user interface by which the user communicates with the manager device and, optionally, with the host system. It is through this WIL program that the user 101 may manually select which CMA(s) they wish to monitor and manage. The user 101 may sort through a catalog of available CMAs and individually select devices on a piecemeal basis or, alternatively, select all devices within a designated facility, vehicle, shipping container, storage area, etc. Once selected, the user may rotate through the available device data (e.g., MAC addresses, ID, origin, etc.) for the chosen devices. As yet a further option, device selection may be achieved by the user providing a MAC address for each desired CMA to the manager device via the WIL. For instance, a user may select one or more MAC addresses from a MAC address database; a corresponding ACL is created, passed to the WIL to communicate and upload to a manager, and the WIL calls for a manager ACL and compares to a previously provided ACL to verify the contents thereof.

From subroutine process block 207, the method 200 of FIG. 3 proceeds to document process block 209 to create and/or update a manager access control list. Essentially, the manager ACL may be constructed by the host computer 112, stored on and accessed through the cloud computing host service 124, and updated using a graphical user interface (GUI) feature within the WIL on the manager device 110. A manager ACL may be created by altering an existing ACL text file with the MAC addresses and ID data for CMUs of the selected CMAs, and downloading this file to the manager device. The host computer 112 may write a new ACL file for each user-input selection of CMUs.

After an ACL is updated at document process block 209, the method 200 ascertains whether or not the manager ACL was successfully updated at decision block 211. With reference again to the representative host system 100 architecture of FIG. 2, the host computer 112 may ping the manager device 110 to transmit an electronic copy of the manager ACL that is stored in its resident cache memory. The host computer 112, upon receipt of the copy, compares the manager ACL to a master ACL created by the host computer 112. This comparison may include the host computer 112 serially evaluating the MAC addresses and ID data in the manager ACL against those enumerated in the master ACL; if they match, then the manager ACL has been successfully updated. If the manager ACL did not successfully update (Block 211=NO), the method 200 may loop back to subroutine process block 207 and select a new batch of CMUs.

Responsive to a determination that the manager ACL successfully updated (Block 211=YES), method 200 advances to process block 213 and broadcasts an electronic ping to the individual CMUs of the selected CMAs in order to establish a wireless connection between each CMU and the manager device. For at least some system architectures, the electronic ping may include a network data packet with, among other control and payload information, a command signal to shift a desired CMU from a sleep mode to an awake mode. Once woken, a packet-switching wireless connection may be established between the two devices. Decision block 215 thereafter verifies whether or not a wireless connection is successfully established with each CMU. If not (Block 215=NO), method 200 loops back to process block 211 and transmits a new electronic ping to each of the CMUs in which the wireless connection failed.

Upon determining that a wireless connection is successfully established with a CMU (Block 215=YES), method 200 continues to data block 217 and downloads the CMA device data from the corresponding CMU to the manager device. As indicated above, the device data retrieved from a CMU 76 by the manager device 110 may comprise any logically relevant type of data, including device diagnostics data, device fault data, cell voltage and temperature data, SOH data, SOC data, real-time and/or scheduled operating mode data, historical device data, etc. In the same vein, the host computer 112 (or the manager device 110) may concurrently acquire a data date/time stamp, real-time device location data, and/or scheduled device destination data, as indicated at data block 219 of FIG. 3. In a non-limiting example, a manager device may retrieve and upload respective battery voltage and temperature data from a set of elected battery modules; a host computer device receives this uploaded data, generates an appropriate timestamp for each file, adds location data, and updates the corresponding CMA file(s) in the database. An operator may then access and edit the database-stored CMA files, including adding notes, such as repair notes or change in schedule notes. Select data may then be deleted from the CMU's resident memory. For database storage block 221, the WBMS database is then updated to include any or all portions of the data retrieved at data blocks 217 and 219.

Decision block 223 determines whether or not the WBMS database was successfully updated with the select portion(s) of retrieved data. If not (Block 223=NO), method 200 loops back to database storage block 221 and reattempts to store the CMA device data retrieved from the CMU in the WBMS database. On the other hand, upon determining that the WBMS database successfully updated (Block 223=YES), the operating mode for the CMU is switched, e.g., from an awake mode to a sleep more, a default operating mode, or a desired operating mode. For instance, the operating mode of a CMU may be switched by transmitting an electronic command prompt to the CMU to transition from a manager-prompted wake mode to a continuously awake inventory mode. Method 200 may thereafter confirm, at subroutine terminator block 227, that the manager device is primed for the next device in the manager ACL and concomitantly loops back to process block 213. After the device data for all selected CMAs within the manager ACL has been collected, the method 200 of FIG. 3 may advance from process block 225 to terminal block 229 and temporarily discontinue, or may loop back to terminal block 201 and run in a continuous loop.

With reference next to FIG. 4, the method 300 begins a decision block 301 with determining how often CMA device data is needed from a CMU. Device data timing and frequency may be determined by the stage or destination of a given battery module. For example, a traction battery module of a motor vehicle that is placed into storage may necessitate that data be taken once per week or less. Comparatively, a service location that continuously rotates through functioning and faulty modules may need daily if not continual real-time device data. The data system may be customizable to allow for flexibility in the standards by which data timing and frequency is determined and the parameters associated therewith.

Upon determining that continuous CMA monitoring is desired at decision block 301, the method 300 proceeds to process block 303 and the host system sets the CMU(s) to Managed-Inventory Mode. Process block 305 provides processor-executable instructions for the manager device to receive a continuous feed of CMA data from each wirelessly connected CMU. Contemporaneous with or following data collection, the manager device systematically pushes device data to the WBMS database, as indicated at process block 307. Method 300 of FIG. 4 may thereafter advance to terminal block 309 and terminate, or may loop back to terminal block 301 and run in a continuous loop.

Responsive to a determination that time-based, rather than continuous, CMA monitoring is desired at decision block 301, the method 300 proceeds to process block 311 and identifies the scheduling parameters for Timer Mode (e.g., wake CMU every 1, 3 or 7 days). Time Mode and its associated settings may be predefined by the host system or manually selected by an operator, e.g., based on a desired application or selectively customizable. At process block 313, the CMU wakes per interval setting and saves the CMA device data. Once saved, the method moves from process block 313 to decision block 315 to determine if there is a sufficient amount of storage space remaining in resident memory for newly acquired device data. If not (Block 315=NO), the method 300 shifts to process block 317 and identifies the oldest data saved to resident memory based on data date/time stamp, overwrites a sufficient amount of this "old" data and, once complete, sets a flag that this data has been deleted.

Responsive to a determination that there is sufficient storage space remaining in resident memory for the new device data (Block 315=NO), the method 300 shifts to process block 319 and wirelessly connects the manager device to an available CMU of a selected CMA. Subsequently, the manager downloads the device data from the CMU and, optionally, clears the downloaded CMA device data while synchronously updating the WBMS database at process block 321. Method 300 thereafter advances to process block 323 and disconnects the manager device from the CMU. After the manager device is disconnected at process block 323, the method may either loop back to process block 311, advance to terminal block 309 and terminate, or may loop back to terminal block 301 and run in a continuous loop.

Aspects of this disclosure may be implemented, in some embodiments, through a computer-executable program of instructions, such as program modules, generally referred to as software applications or application programs executed by any of a controller or the controller variations described herein. Software may include, in non-limiting examples, routines, programs, objects, components, and data structures that perform particular tasks or implement particular data types. The software may form an interface to allow a computer to react according to a source of input. The software may also cooperate with other code segments to initiate a variety of tasks in response to data received in conjunction with the source of the received data. The software may be stored on any of a variety of memory media, such as CD-ROM, magnetic disk, and semiconductor memory (e.g., various types of RAM or ROM).

Moreover, aspects of the present disclosure may be practiced with a variety of computer-system and computer-network configurations, including multiprocessor systems, microprocessor-based or programmable-consumer electronics, minicomputers, mainframe computers, and the like. In addition, aspects of the present disclosure may be practiced in distributed-computing environments where tasks are performed by resident and remote-processing devices that are linked through a communications network. In a distributed-computing environment, program modules may be located in both local and remote computer-storage media including memory storage devices. Aspects of the present disclosure may therefore be implemented in connection with various hardware, software, or a combination thereof, in a computer system or other processing system.

Any of the methods described herein may include machine readable instructions for execution by: (a) a processor, (b) a controller, and/or (c) any other suitable processing device. Any algorithm, software, control logic, protocol or method disclosed herein may be embodied as software stored on a tangible medium such as, for example, a flash memory, solid state memory, a hard drive, a CD-ROM, a digital versatile disk (DVD), or other memory devices. The entire algorithm, control logic, protocol, or method, and/or parts thereof, may alternatively be executed by a device other than a controller and/or embodied in firmware or dedicated hardware in an available manner (e.g., implemented by an application specific integrated circuit (ASIC), a programmable logic device (PLD), a field programmable logic device (FPLD), discrete logic, etc.). Further, although specific algorithms are described with reference to flowcharts depicted herein, many other methods for implementing the example machine-readable instructions may alternatively be used.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed:

1. A method of operating a wireless battery management system (WBMS), the WBMS including a plurality of cell module assemblies (CMA) each having a respective battery module and a respective cell monitoring unit (CMU), the method comprising:
    storing, in a WBMS database of the WBMS, respective media access control (MAC) addresses and identification (ID) data for the CMAs;
    selecting, via a wireless-enabled manager device, a batch of the CMAs to communicate with to thereby retrieve data for their respective battery modules;
    generating a manager access control list (ACL) with the respective MAC addresses and ID data for the selected batch of the CMAs, wherein generating the manager ACL includes:
        retrieving, via a remote computing device from the WBMS database, the respective MAC addresses and ID data for each of the selected CMAs;
        creating, via the remote computing device, a text file with the respective MAC addresses of the selected CMAs; and
        uploading the text file from the remote computing device to the manager device;
    establishing a wireless connection between the manager device and the respective CMUs for the selected CMAs based on the MAC addresses and the ID data in the manager ACL;
    downloading, via the manager device from the respective CMUs of the selected CMAs, device data for each of the battery modules associated with the selected CMAs; and
    switching an operating mode for each of the respective CMUs.

2. The method of claim 1, further comprising transmitting, via the CMAs to the WBMS database of the WBMS, the MAC addresses and the ID data.

3. The method of claim 1, wherein selecting the batch of the CMAs includes receiving a user-input selection via a wireless interface library (WIL) operating on the manager device, the user-input selection identifying which of the plurality of CMAs to communicate with the manager device.

4. The method of claim 1, further comprising:
    transmitting the generated manager ACL from the manger device to a remote computing device;
    comparing the manager ACL with a master ACL via the remote computing device to determine if the MAC addresses in the manager ACL correspond with an associated list of MAC addresses in the master ACL; and
    selecting a new batch of the CMAs via the manager device in response to the MAC addresses in the manager ACL not corresponding with the associated list of MAC addresses in the master ACL.

5. The method of claim 1, wherein establishing the wireless connection includes the manager device wirelessly transmitting an electronic ping to the respective CMU of each of the CMAs in the batch of CMAs.

6. The method of claim 5, wherein the transmitted electronic ping causes the CMU to transition from a sleep mode to an awake mode.

7. The method of claim 5, further comprising:
    determining if the wireless connection is successfully established with each of the CMUs; and
    transmitting a new electronic ping to each of the CMUs in which it is determined that the wireless connection was not successfully established with the CMU.

8. The method of claim 1, further comprising transmitting, via the manager device to each of the CMUs of the selected CMAs, a command prompt to clear device data from a resident memory device of the CMU after downloading the device data via the manager device.

9. The method of claim 1, further comprising transmitting, via the manager device to the WBMS database of the WBMS, the downloaded device data for the battery modules of the selected batch of the CMAs.

10. The method of claim 1, wherein switching the operating mode includes transmitting a command prompt to each of the respective CMUs to transition from a manager-prompted wake mode to a continuously awake inventory mode.

11. The method of claim 1, further comprising retrieving respective location, destination, mode, and/or history data for each of the selected CMAs via the manager device.

12. The method of claim 1, wherein the device data includes cell voltage data, cell temperature data, state of charge (SOC) data, and/or cell state of health (SOH) data.

13. A method of operating a wireless battery management system (WBMS), the WBMS including a plurality of cell module assemblies (CMA) each having a respective battery module and a respective cell monitoring unit (CMU), the method comprising:
    selecting, via a wireless-enabled manager device, a batch of the CMAs to communicate with to thereby retrieve data for their respective battery modules;
    generating a manager access control list (ACL) with respective media access control (MAC) addresses and identification (ID) data for the selected batch of the CMAs;
    transmitting the generated manager ACL from the manger device to a remote computing device;
    comparing, via the remote computing device, the manager ACL with a master ACL to determine if the MAC addresses in the manager ACL correspond with an associated list of MAC addresses in the master ACL;

selecting a new batch of the CMAs in response to the MAC addresses in the manager ACL not corresponding with the associated list of MAC addresses in the master ACL;

establishing a wireless connection between the manager device and the respective CMUs of the selected CMAs in the new batch of the CMAs based on the respective MAC addresses and ID data of the new batch of the CMAs;

downloading, via the manager device from the respective CMUs of the selected CMAs in the new batch of the CMAs, device data for each of the battery modules associated with the selected CMAs in the new batch of the CMAs; and switching an operating mode for each of the respective CMUs in the new batch of the CMAs.

14. The method of claim 13, further comprising transmitting, via the CMAs to a WBMS database of the WBMS, the MAC addresses and the ID data, wherein generating the manager ACL includes retrieving the respective MAC address and ID data for each of the selected CMAs from the WBMS database.

15. The method of claim 14, wherein generating the manager ACL further includes:

creating, via the remote computing device, a text file with the respective MAC addresses of the selected CMAs; and uploading the text file from the remote computing device to the manager device.

16. The method of claim 13, wherein selecting the batch of the CMAs includes receiving a user-input selection via a wireless interface library (WIL) operating on the manager device, the user-input selection identifying which of the plurality of CMAs to communicate with the manager device.

17. The method of claim 13, wherein establishing the wireless connection includes the manager device wirelessly transmitting an electronic ping to the respective CMU of each of the CMAs in the batch of CMAs.

18. The method of claim 17, wherein the transmitted electronic ping causes the CMU to transition from a sleep mode to an awake mode.

19. The method of claim 1, further comprising transmitting, via the manager device to each of the CMUs of the selected CMAs, a command prompt to clear device data from a resident memory device of the CMU after downloading the device data via the manager device.

20. A method of operating a wireless battery management system (WBMS), the WBMS including a plurality of cell module assemblies (CMA) each having a respective battery module and a respective cell monitoring unit (CMU), the method comprising:

selecting, via a wireless-enabled manager device, a batch of the CMAs to communicate with to thereby retrieve data for their respective battery modules;

generating a manager access control list (ACL) with respective media access control (MAC) addresses and identification (ID) data for the selected batch of the CMAs;

establishing a wireless connection between the manager device and the respective CMUs for the selected CMAs based on the MAC addresses and the ID data in the manager ACL, wherein establishing the wireless connection includes:

wirelessly transmitting, via the manager device, an electronic ping to the respective CMU of each of the CMAs in the selected batch of the CMAs;

determining if the wireless connection is successfully established with each of the CMUs; and transmitting a new electronic ping to each of the CMUs in which it is determined that the wireless connection was not successfully established with the CMU;

downloading, via the manager device from the respective CMUs of the selected CMAs, device data for each of the battery modules associated with the selected CMAs; and switching an operating mode for each of the respective CMUs.

* * * * *